US006282132B1

(12) United States Patent
Brown et al.

(10) Patent No.: US 6,282,132 B1
(45) Date of Patent: Aug. 28, 2001

(54) DATA-STROBE INPUT BUFFERS FOR HIGH-FREQUENCY SDRAMS

(75) Inventors: Jason M. Brown, Coppell; Daniel B. Penney, Wylie, both of TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/650,550

(22) Filed: Aug. 30, 2000

(51) Int. Cl.$^7$ ........................................... G11C 7/00
(52) U.S. Cl. ................................. 365/193; 365/233
(58) Field of Search ............................ 365/193, 191, 365/233, 233.5

(56) References Cited

U.S. PATENT DOCUMENTS 5,349,566 * 9/1994 Merritt et al. ................... 365/233.5
5,812,492 * 9/1998 Yamauchi et al. ................ 365/233.5
6,115,314 * 9/2000 Wright et al. .................... 365/230.02

* cited by examiner

Primary Examiner—Son Mai
(74) Attorney, Agent, or Firm—Schwegman, Lundberg, Woessner & Kluth, P.A.

(57) ABSTRACT

A device is discussed that enables an input buffer to recognize the first rising edge of a strobe so as to validate data. In one embodiment, a method for enabling recognition of valid data in a DDR SDRAM is discussed. The method includes analyzing memory commands before a setup time is expired, and validating the data to input into the DDR SDRAM when the act of analyzing memory commands enables a circuit to recognize the first rising edge of a strobe so as to validate the data. In another embodiment, a device for enabling validation of data in a DDR SDRAM is discussed. The device includes an analyzer to analyze commands to produce a write signal, and an enabling circuit to produce an enabling signal before the write signal is confirmed to recognize a first rising edge of a strobe so as to validate the data.

40 Claims, 3 Drawing Sheets

DATA-STROBE INPUT BUFFERS FOR HIGH-FREQUENCY SDRAMS

TECHNICAL FIELD

The present invention relates generally to semiconductor integrated circuits. More particularly, it pertains to devices and methods to enable data-strobe input buffers to recognize strobe signals for high-frequency synchronous dynamic random access memories.

BACKGROUND

Memory devices are integrated circuits in which information may be stored and from which information may be extracted when desired. Each memory device is built from a plurality of memory cells. Each memory cell memorizes a bit of data. Although a bit of data seems insignificant, it may determine whether the stored information is correct, such as an amount in a checking account.

The process of memorizing the bit of data by the memory cell is an example of the ingenuity of a memory device. Each memory device performs many other feats of engineering. The notion that information may be stored and extracted when desired involves the element of time. Memory device activities are timed to predictively perform according to a train of pulses. This train of pulses can be likened to the gestures of a conductor conducting a symphony. In the parlance of engineering, this train of pulses is known as a clock, and more specifically, the train of pulses is called a strobe when it is used to initiate the passage of data.

To start the process of memorizing the bit of data by the memory cell, a write signal is issued so that the bit of data may be written to the memory cell. The memory device, which houses the memory cell, delays the writing of the bit of data for a period of time until the write signal is validated by an appropriate transition in the strobe. Such a strategy may be fine for memory devices that are designed to work at low speeds, but it creates problems for the proper operation of future generations of memory devices.

Thus, what is needed are devices and methods to recognize the transition of the strobe at an appropriate time so as to enhance the speed of operations of future generations of memory devices, such as synchronous DRAMs (SDRAMs), and specifically, double-data-rate SDRAMs (DDR SDRAMs).

SUMMARY

The above-mentioned problems with memory devices and other problems are addressed by the present invention and will be understood by reading and studying the following specification. Devices and methods are described which accord these benefits.

One illustrative embodiment includes a method for enabling recognition of valid data in an SDRAM. The method comprises analyzing memory commands before a setup time is expired and validating the data to input into the SDRAM. The act of validating occurs when the act of analyzing memory commands enables a circuit to recognize the first rising edge of a strobe so as to validate the data.

Another illustrative embodiment includes another method for enabling recognition of valid data in an SDRAM. The method includes analyzing to issue a write signal before a setup time is expired, enabling a circuit to validate the data if the write signal is issued, and inhibiting the circuit from being enabled if the write signal is issued in the presence of noise.

Another illustrative embodiment includes a device for enabling validation of data in a DDR SDRAM. The device includes an analyzer to analyze commands to produce a write signal and an enabling circuit to produce an enabling signal before the write signal is confirmed to recognize a first rising edge of a strobe so as to validate the data.

Another illustrative embodiment includes a device for enabling validation of data in a DDR SDRAM. The device includes an analyzer to analyze commands to produce a write signal, an enabling circuit to produce the enabling signal, a verifier to confirm the write signal by reproducing the write signal, a latch to latch at least one of an enabling signal and a disabling signal, a disabling circuit to activate a disabling signal when noise is present, and an inverting circuit to drive at least one of the enabling signal and the disabling signal to recognize a first rising edge of a strobe before the verifying circuit confirms the write signal so as to validate the data.

Another illustrative embodiment includes a synchronous DRAM. The synchronous DRAM includes a bank that defines a portion of a memory array, at least one data input buffer that produces one bit of data, and a circuit that executes at least one of two acts. The two acts include enabling and disabling the at least one data input buffer. The act of enabling enables the at least one data input buffer to recognize a first rising edge of a strobe before a write signal is confirmed so as to validate the data within a desired duration.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
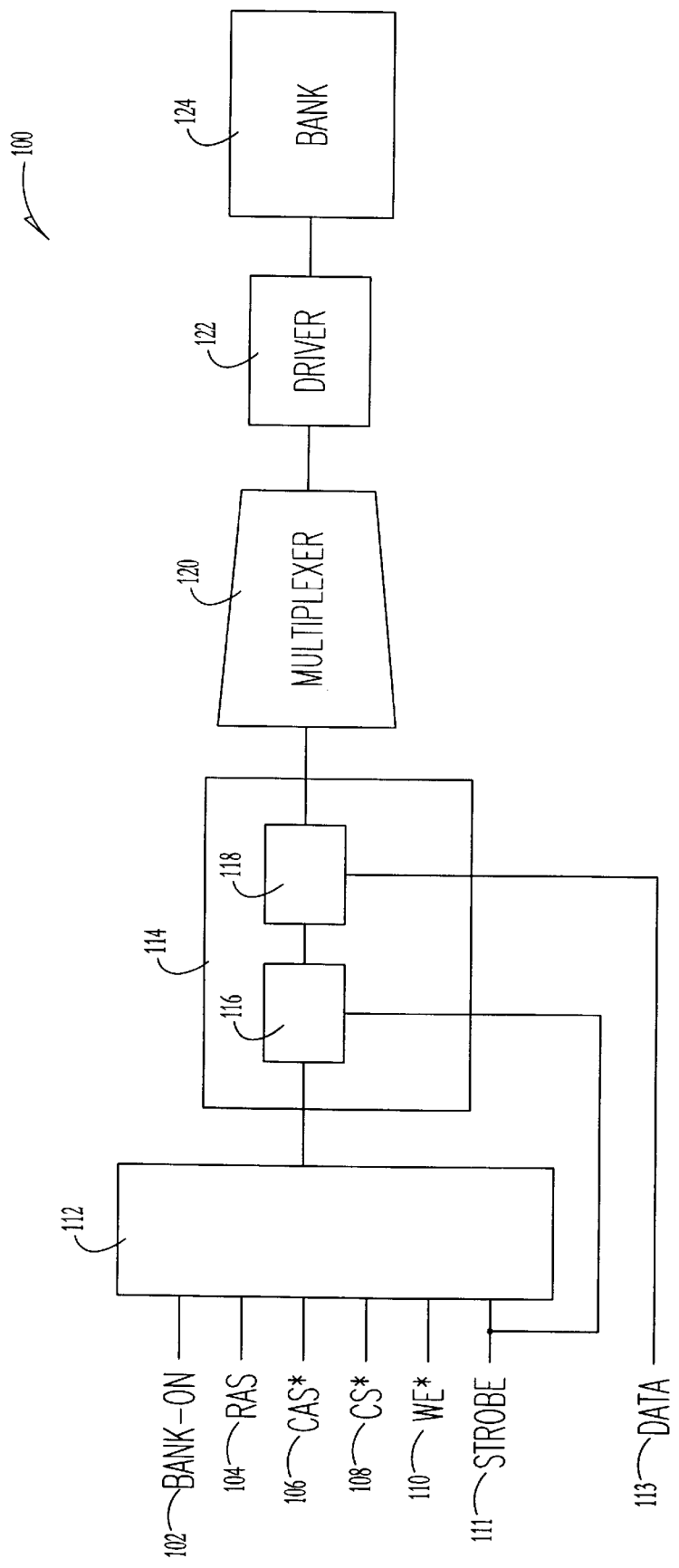
FIG. 1 is a system diagram according to an embodiment of the invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms "high" and "low" as used herein refer to Vcc, the voltage supply, and ground, respectively. The term "external supply" as used herein refers to Vcc, the voltage supply.

As explained hereinbefore, a strobe is used to initiate the passage of data in a memory device. When a user desires to write data to the memory device, a generator generates the strobe externally to the memory device so as to time the passage of data coming into the memory device. When the user desires to read data from the memory device, the memory device generates the strobe internally so as to time the passage of data coming out from the memory device. Thus, the strobe can be generated bidirectionally.

The memory device includes a circuit that is called a data-strobe input buffer (DQS input buffer) (hereinafter, input buffer). This circuit interprets the strobe that is coming into the memory device when the user desires to write data to the memory device. Specifically, this circuit determines when a transition first occurs in the strobe. In other words, this circuit detects the first rising edge of the train of pulses that is known as the strobe.

The data that is readied to be written into the memory device waits for this first rising edge of the strobe. When the first rising edge is detected, the memory device then receives the data. The data thus can be considered to be validated by the first rising edge of the strobe. At anytime before the first rising edge, the memory device refuses to recognize the data. The circuit that is called the input buffer performs this act of recognition. So basically, the input buffer validates the data for the memory device by detecting the first rising edge of the strobe so that the memory device knows when to receive the data.

The memory device disables the input buffer whenever data is not present to be written to the memory device so as to conserve power. But when data is present, the memory device enables the input buffer to detect the first rising edge of the strobe so as to validate the data. To enable the input buffer, a write command is issued to the memory device. The memory device cannot be sure at the outset whether the write command arises from a desire of the user to write data or from an undesired source: noise. Thus, the memory device waits for a rising strobe edge provided to the memory device to enable the input buffer so as to eliminate any false write commands.

Such waiting is appropriate for memory devices that operate at low speeds, but is inappropriate for future generations of memory devices, such as DDR SDRAMs. Typical speed of a DDR SDRAM includes speeds that are greater than about 166 megahertz. The embodiments of the invention solve this problem and other problems as discussed hereinafter.

FIG. 1 is a system diagram according to an embodiment of the invention. The system 100 illustrates a number of circuits in a memory device that operates to store a bit of data. The system 100 includes a device 112 for enabling validation of data in a DDR SDRAM. The device 112 receives several commands, such as bank-on signal 102, row-address strobe (RAS) 104, column-address strobe (RAS*) 106, chip-select signal (CS*) 108, write-enable signal (WE*) 110, and a strobe 111.

The bank-on signal 102 indicates that at least one row in a bank of memory cells is activated. The row-address strobe 104 indicates that a particular row or a set of rows is to be accessed. The column-address strobe 106 indicates that a particular column or a set of columns is to be accessed. The row-address strobe 104 and the column-address strobe 106 together specify a set of memory cells, which reside at particular rows and columns, to be accessed. The chip-select signal 108 specifies a particular memory device to be accessed; there may be many memory devices in a system. The write-enable signal 10 indicates that a write operation is desired for a particular memory device. And, the strobe 111 is used to time the operations of the device 112. These commands 102–110 and strobe 111 are presented at the pins of the integrated circuit embodying the system 100.

The device 112 analyzes the commands to issue an enabling signal if the commands suggest that a write operation is desired; otherwise, a disabling signal is issued. The device 112 presents either the enabling signal or the disabling signal at the input buffer 114. Recall that the input buffer validates the data for the memory device by detecting the first rising edge of the strobe so that the memory device knows when to receive the data.

The input buffer 114 includes an input stage 116 and a latch 118. The input stage 116 receives either the enabling signal or the disabling signal that is presented to the input buffer 114. The disabling signal disables the input stage 116 from detecting the first rising edge of the strobe 111. The enabling signal enables the input stage 116 from detecting the first rising edge of the strobe 111. When the input stage 116 detects the first rising edge of the strobe 111, data 113 is allowed to pass into a latch 118. This passage of data from being external to the system 100 into the latch 118 validates the data.

In memory devices that operate at low speeds, the enabling signal is delayed for a period of time before it is presented to the input stage 116. Such a delay creates a problem in that the input stage 116 is unable to detect the first rising edge of the strobe 111 in time to validate the data 113 in memory devices that operate at higher speeds. The device 112 of the various embodiments of the invention enhances the delay by not waiting until the period of time is expired before issuing the enabling signal to enable the input stage 116. The notion of enhancing the delay means that the embodiments of the invention do not eliminate the delay but yet are still able to issue the enabling signal even with the presence of the delay. In one embodiment, such a feat is possible because the device 112 includes an asynchronous circuit that can issue the enabling signal in the presence of the delay.

The input buffer 114, which latches the data 113 by the latch 118, presents the data to a data multiplexer 120. The data multiplexer 120 offers great flexibility to the system 100 by allowing a desired memory configuration to be supported. The data multiplexer 120 then presents the data to a write-driver circuit 122. The write-driver circuit 122 prepares the data to be written into a desired memory location. The write-driver circuit 122 then presents the data to the desired memory cell or the set of memory cells in the bank 124 where the data is written.

Figure 2:
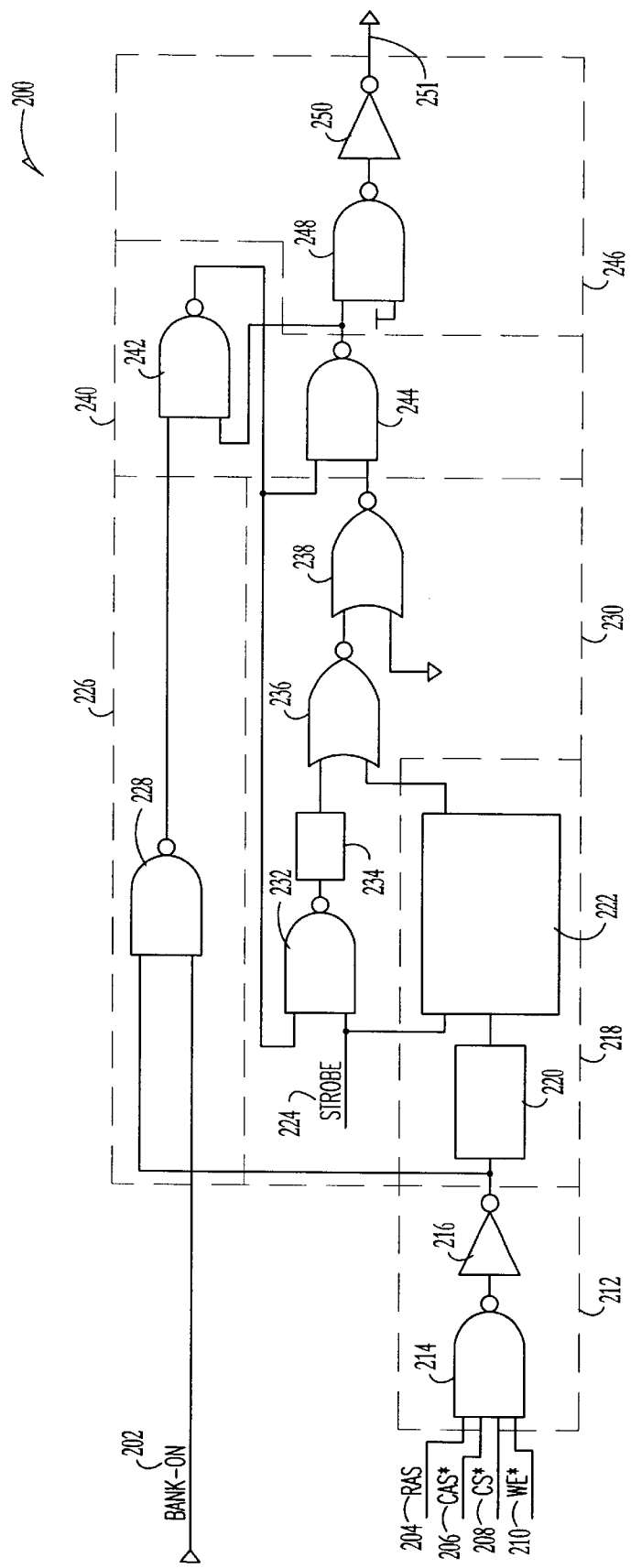
FIG. 2 is a circuit diagram according to an embodiment of the invention.

FIG. 2 is a circuit diagram according to an embodiment of the invention. The device 200 is similar to the device 112, which was discussed hereinbefore in FIG. 1. Thus, the device 200 is for enabling the validation of data in a memory device, such as a DDR SDRAM. The device 200 includes an analyzer 212 to analyze commands to produce a write signal.

The analyzer 212 includes a NAND gate 214 that receives commands. The commands include a row-address strobe 204, a column-address strobe 206, a chip-select signal 208, and a write-enable signal 210. From these commands the NAND gate 214 produces the write signal. The activation of all of these commands would indicate that there is a likelihood that a write operation is desired. To indicate such, the write signal is low when each command is high. Otherwise, the write signal is high when at least one of the commands is low so as to indicate that it is unlikely that a write operation is desired.

The NAND gate 214 presents the write signal to a buffer 216. The buffer 216 drives the write signal for subsequent circuit stages of the device 200. In one embodiment, the buffer 216 inverts the write signal.

The analyzer 212 presents the write signal to a verifier 218. The verifier 218 confirms the write signal by reproducing the write signal for processing by subsequent circuit stages. The verifier 218 includes a delay circuit 220. The delay circuit 220 receives the write signal and delays the write signal from progressing until a period of time expires. The period of time is greater than about 1.5 nanoseconds to about 2 nanoseconds.

The delay circuit 220 presents the write signal, which is delayed, to a noise-eliminator circuit 222. The noise-eliminator circuit 222 also receives a strobe. If there is no noise, the noise-eliminator circuit 222 confirms the write signal by reproducing the write signal. In other words, the noise-eliminator circuit 222 reproduces the write signal if the write signal, which is delayed by the delay circuit 220, is high when the strobe goes high. A write signal that is spuriously generated by noise is unlikely to have a relationship to the strobe. Thus, by looking at the relationship of the write signal (which is delayed) to the strobe, the noise-eliminator circuit 222 can determine whether the write signal is a true signal.

In one embodiment, the noise-eliminator circuit 222 includes a D flip-flop 222 having a Q output. The D flip-flop 222 receives the strobe 224 and the write signal, which is produced by the delay circuit. The D flip-flop reproduces the write signal at the Q output if the write signal is high when the strobe 224 goes high.

The analyzer 212 also presents the write signal to an enabling circuit 226. The enabling circuit 226 receives the write signal from the analyzer 212 as well as a bank-on signal 202. In one embodiment, the enabling circuit 226 includes a NAND gate. The enabling circuit 226 produces an enabling signal depending on the logic level of the write signal and the bank-on signal 202. The enabling signal is active, which means it is low, when the write signal is high and the bank-on signal 202 is high. Thus, an active enabling is issued when there is a desire to write, which is indicated by a high write signal, and at least one row of a memory bank is active, which is indicated by a high bank-on signal 202.

The analyzer 212 contemporaneously presents the write signal to the enabling circuit 226 and the verifier 218. The enabling circuit 226 issues the enabling signal before the verifier 218 confirms the write signal. The enabling circuit 226 operates without a strobe to issue the enabling signal, unlike the verifier 218. Thus, the enabling circuit 226 can be considered an asynchronous circuit. In this regard, the enabling circuit 226 enhances the need of the system 200 to check for noise via the verifier 218 while producing the enabling signal early enough so that the input buffer can recognize the first rising edge of the strobe to validate data.

The enabling circuit 228 presents the enabling signal to a latch 240. The latch 240 stores either the enabling signal or a disabling signal as a stored signal, and continuously reproduces the stored signal. In one embodiment, the latch 240 is an SR latch 240. The SR latch 240 includes a NAND gate 242 and another NAND gate 244. The output of the NAND gate 242 is called the Q output and the output of the NAND gate 244 is called the Q' output. The Q output is defined to be complementary to the Q' output. The NAND gate 242 receives the enabling signal at the S input as well as the Q' output. The NAND gate 244 receives the disabling signal at the R input as well as the Q output.

In one embodiment, when the enabling circuit 226 presents an active enabling signal (which in this instance means the enabling signal is low) to the SR latch at the S input, the SR latch 240 stores the active enabling signal, and continuously reproduces the stored active enabling signal. Specifically, when the active enabling signal is presented to the S input, the NAND gate 242 produces a disabling signal, which is high, at the Q output. This disabling signal will be discussed subsequently. The Q output presents the disabling signal, which is high, to the NAND gate 244. The R input of the NAND gate 244 is likely to receive a signal that is also at a high logic level. This must be the case because only one of the S input and the R input can receive a signal at a low logic level at any point in time for an SR latch that comprises NAND gates.

Thus, the NAND gate 244 produces a low signal at the Q' output. This low signal at the Q' output is a reproduction of the active enabling signal, which was presented at the S input of the NAND gate 242. This active enabling signal can proceed to enable the input buffer so that the input buffer can detect the first rising edge of the strobe to validate the data.

Suppose that the enabling signal, which is presented to the SR latch at the S input, is inactive. Suppose further that an active disabling signal, which is high, is presented to the SR latch at the R input. The NAND gate 244 will output a high signal at the Q' output. The high signal will be input into the NAND gate 242. Because the NAND gate 242 receives the high signal and the inactive enabling signal, which is high, the NAND gate 242 produces a low signal at the Q output. The low signal at the Q output enters the NAND gate 244 to cause the NAND gate 244 to reproduce the high signal at the Q' output. This high signal will disable the input buffer from detecting the first rising edge of the strobe. The disabling signal is used to disable the input buffer so as to save power when a writing operation is not desired.

Returning to the case when the enabling circuit 226 produces an active enabling signal, which is high. This active enabling signal enters the S input of the SR latch 240. The NAND gate 242 in response to the active enabling signal produces an active disabling signal, which is low, at the Q output. As discussed hereinbefore, the active disabling signal enters the companion NAND gate 244 of the SR latch 240. But additionally, the active disabling signal also enters the disabling circuit 230. The disabling circuit 230 serves to pass the active disabling signal to the SR latch 240 if noise is present. Otherwise, the disabling circuit 230 will inactive an active disabling signal.

The active disabling signal enters a NAND gate 232 of the disabling circuit 230. The NAND gate 232 also receives the strobe 224. When the disabling signal is active, which is high, and the strobe 224 goes high, the NAND gate 232 passes the active disabling signal. In the process of passing, the NAND gate 232 inverts the active disabling signal from high to low.

The NAND gate 232 presents the active disabling signal, which is now low, to a delay circuit 234. The delay circuit 234 receives the active disabling signal and reproduces the active disabling signal after a period of time. In one embodiment, the period of time is about 2 nanoseconds.

The delay circuit 234 presents the active disabling signal, which is low, to a NOR gate 236. The NOR gate 236 receives the active disabling signal as well as the reproduced write signal from the noise-eliminator circuit 222 of the verifier 218. If the reproduced write signal is low, which means that noise is present, the NOR gate 236 passes the active disabling signal. In the process of passing, the NOR gate 236 inverts the active disabling signal from low to high. If the reproduced write signal is high, which means that the verifier 218 confirms the write signal, the NOR gate 236 will inactive the active disabling signal, which is low. In the process of inactivation, the NOR gate 236 passes the disabling signal, which is low.

The NOR gate 236 presents the disabling signal to another NOR gate 238. The NOR gate 238 receives the disabling signal as well as a ground signal. Therefore, the NOR gate 238 acts like an inverter that inverts the disabling signal. Essentially, the NOR gate 238 drives the disabling signal toward the R input of the SR latch 240.

If the disabling signal is active, which is low, the SR latch 240 passes the disabling signal to the Q' output. In the process of passing, the SR latch 240 inverts the disabling signal to high. This high disabling signal will disable the input buffer from detecting the first rising edge of the strobe.

The device 200 includes an inverting circuit 246. The inverting circuit 246 includes a NAND gate 248. The NAND gate 248 couples to the Q' output of the SR latch 240. The NAND gate 248 also couples to a power supply. Consequently, the NAND gate 248 acts like an inverter. The NAND gate presents a signal, which is inverted, to an inverter 250. The inverter 250 receives the signal, inverts the signal, and presents the signal at signal 251. Signal 251 can either be an active enabling signal, which is low, or an active disabling signal, which is high.

Figure 3:
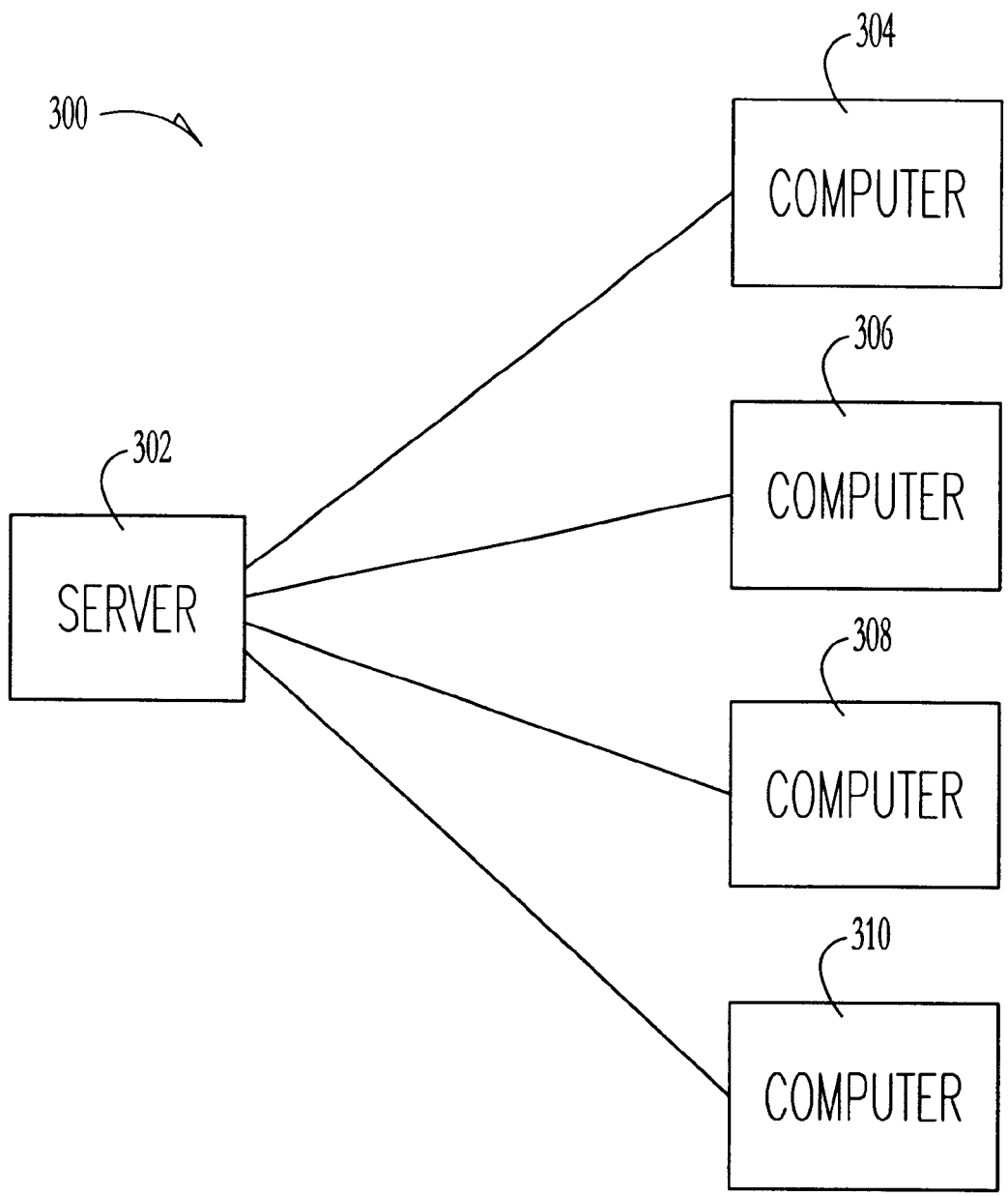
FIG. 3 is a system diagram according to an embodiment of the invention.

FIG. 3 is a system diagram according to an embodiment of the invention. The system 300 includes a server 302. The server 302 includes a network server. The server 302 serves as a platform for e-commerce, data visualization, data mining, and other streaming data applications. The server 302 includes various embodiments of the invention in its memory devices.

The system 300 also includes client computers 304–310. The client computers include stand-alone personal computers, laptop computers, and handheld computers, as well as wireless devices such as cellular phones and personal digital assistants.

CONCLUSION

Systems, devices, and methods have been discussed to enable the detection of the first rising edge of the strobe to be much quicker for future generations of memory devices. The embodiments of the invention achieve this by adding an asynchronous circuit so as to enhance a synchronous circuit. The synchronous circuit ensures that the write signal is a valid write signal—one that is not arisen from noise. The asynchronous circuit quickly assesses whether a write signal is present, proceeds to enable the detection of the first rising edge of the strobe, and adaptively changes its initial assessment if the write signal turned out to have arisen from noise.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

We claim:

1. A method for enabling recognition of valid data in an SDRAM, comprising:
    analyzing memory commands before a setup time is expired;
    validating the data to input into the SDRAM when the act of analyzing memory commands enables a circuit to recognize the first rising edge of a strobe so as to validate the data;
    wherein analyzing includes analyzing memory commands to produce a write signal wherein the write signal is adapted to enable the circuit to recognize the first rising edge of the strobe: and
    wherein analyzing includes analyzing memory commands, wherein the memory commands are selected from a group consisting of a row-address strobe, a column-address strobe, a write-enable signal, and a chip-select signal.

2. The method of claim 1 wherein analyzing includes analyzing to produce a write signal to enable the circuit when the row-address strobe is high, the column-address strobe is high, the write-enable signal is high, and the chip-select signal is high.

3. The method of claim 1, wherein the method is adapted to execute for a double-data rate SDRAM at a high frequency, wherein the high frequency is greater than about 166 megahertz.

4. A method for enabling recognition of valid data in an SDRAM, comprising:
    analyzing to issue a write signal before a setup time is expired;
    enabling a circuit to validate the data if the write signal is issued; and
    inhibiting the circuit from being enabled if the write signal is issued in the presence of noise.

5. The method of claim 4, wherein analyzing includes analyzing a combination of memory commands, wherein the memory commands are selected from a group consisting of a row-address strobe, a column-address strobe, a write-enable signal, and a chip-select signal.

6. The method of claim 4, wherein enabling includes enabling a circuit that includes an input buffer that recognizes a first rising edge of a strobe so as to validate the data.

7. The method of claim 4, wherein inhibiting includes inhibiting the circuit from being enabled when a strobe is high and the write signal is low.

8. The method of claim 4, wherein the method is adapted to execute for a double-data rate SDRAM at a high frequency, wherein the high frequency is greater than about 166 megahertz.

9. A device for enabling validation of data in a DDR SDRAM, comprising:
    an analyzer to analyze commands to produce a write signal; and
    an enabling circuit to produce an enabling signal before the write signal is confirmed to recognize a first rising edge of a strobe so as to validate the data.

10. The device of claim 9, wherein the analyzer is receptive to commands, wherein the commands are selected from a group consisting of a row-address strobe, a column-address strobe, a chip-select signal, and a write-enable signal.

11. The device of claim 10, wherein the analyzer produces the write signal that is low when each command is high.

12. The device of claim 10, wherein the analyzer includes a NAND gate to receive the row-address strobe, the column-address strobe, the chip-select signal, and the write-enable signal.

13. The device of claim 12, wherein the analyzer further includes a buffer, which receives the write signal, so as to drive the write signal for subsequent circuit stages.

14. A device for enabling validation of data in a DDR SDRAM, comprising:
- an analyzer to analyze commands to produce a write signal;
- a verifier to confirm the write signal by reproducing the write signal; and
- an enabling circuit to produce an enabling signal, wherein the enabling signal enables a recognition of a first rising edge of a strobe before the verifying circuit confirms the write signal so as to validate the data.

15. The device of claim 14, wherein the verifier includes a delay circuit that receives the write signal and produces the write signal after a period of time has expired.

16. The device of claim 14, wherein the period of time includes greater than about 1.5 nanoseconds to less than about 2 nanoseconds.

17. The device of claim 16, wherein the verifier includes a noise-eliminator circuit, wherein the noise-eliminator circuit receives a strobe and the write signal, which is produced by the delay circuit, and wherein the noise-eliminator circuit confirms the write signal by reproducing the write signal if the write signal is high when the strobe goes high.

18. The device of claim 17, wherein the noise-eliminator circuit includes a D flip-flop having a Q output, wherein the D flip-flop receives the strobe and the write signal, which is produced by the delay circuit, and wherein the D flip-flop reproduces the write signal at the Q output if the write signal is high when the strobe goes high.

19. A device for enabling validation of data in a DDR SDRAM, comprising:
- an analyzer to analyze commands to produce a write signal;
- a verifier to confirm the write signal by reproducing the write signal;
- a disabling circuit to activate a disabling signal when noise is present; and
- an enabling circuit to produce an enabling signal, wherein the enabling signal enables a recognition of a first rising edge of a strobe before the verifying circuit confirms the write signal so as to validate the data.

20. The device of claim 19, wherein the disabling circuit includes a NAND gate that receives a disabling signal and a strobe, wherein the disabling signal passes through the NAND gate when the disabling signal is high and the strobe goes high, and wherein the NAND gate transforms the disabling signal to low.

21. The device of claim 20, wherein the disabling circuit includes a delay circuit that receives the disabling signal and reproduces the disabling signal, which is delayed for a period of time, wherein the period of time is about 2 nanoseconds.

22. The device of claim 21, wherein the disabling circuit includes a first NOR gate that receives the disabling signal, which was delayed for the period of time, and the write signal, wherein the disabling signal passes through the first NOR gate when the disabling signal is low and the write signal is low, and wherein the NOR gate transforms the disabling signal to high.

23. The device of claim 22, wherein the disabling circuit includes a second NOR gate that receives the disabling signal and ground, wherein the disabling signal passes through the second NOR gate, and wherein the second NOR gate inverts the logic level of the disabling signal.

24. A device for enabling validation of data in a DDR SDRAM, comprising:
- an analyzer to analyze commands to produce a write signal;
- a verifier to confirm the write signal by reproducing the write signal;
- a disabling circuit to activate a disabling signal when noise is present;
- a latch to latch at least one of an enabling signal and a disabling signal; and
- an enabling circuit to produce the enabling signal, wherein the enabling signal enables a recognition of a first rising edge of a strobe before the verifying circuit confirms the write signal so as to validate the data.

25. The device of claim 24, wherein the latch includes an SR latch having a S input and a R input, a Q output and a Q' output, wherein the SR latch presents the enabling signal on the Q' output and the disabling signal on the Q output when the SR latch receives the enabling signal, which is low, on the S input.

26. The device of claim 25, wherein the SR latch presents the disabling signal instead of the enabling signal on the Q' output when the SR latch receives the disabling signal at a logic low on the R input, wherein the SR latch receives the disabling signal at a logic low on the R input when the verifying circuit denies the existence of the write signal.

27. The device of claim 24, wherein the latch includes an SR latch having an S input, an R input, a Q output, and a Q' output, wherein the SR latch composes of NAND gates.

28. The device of claim 27, further comprising an inverting circuit, wherein the inverting circuit includes a NAND gate, wherein the NAND gate couples to the Q' output of the SR latch and a logic high signal to produce a first inverted signal, wherein the inverting circuit includes an inverter that receives the first inverted signal and presents a second inverted signal, and wherein the second inverted signal provides a signal to enable a recognition of a first rising edge of a strobe.

29. A device for enabling validation of data in a DDR SDRAM, comprising:
- an analyzer to analyze commands to produce a write signal;
- an enabling circuit to produce the enabling signal;
- a verifier to confirm the write signal by reproducing the write signal;
- a latch to latch at least one of an enabling signal and a disabling signal;
- a disabling circuit to activate a disabling signal when noise is present; and
- an inverting circuit to drive at least one of the enabling signal and the disabling signal to recognize a first rising edge of a strobe before the verifying circuit confirms the write signal so as to validate the data.

30. The device of claim 29, wherein the analyzer is receptive to the commands that include a row-address strobe, a column-address strobe, a chip-select signal, and a write-enable signal, wherein the analyzer produces the write signal at a low logic level when the commands are high, and wherein the analyzer produces the write signal at a high logic level when at least one command is low.

31. The device of claim 30, wherein the enabling circuit receives the write signal and the row-address strobe and produces the enabling signal, wherein the enabling signal is low when the write signal is high and the row-address strobe is high, and wherein the enabling signal is high when at least one of the write signal is low and the row-address strobe is low.

32. The device of claim 31, wherein the verifier receives the write signal after a period of delay and a strobe, wherein the verifier produces the write signal at a logic high level to confirm the write signal when the write signal is high at the time the strobe goes high, and wherein the verifier produces the write signal at a logic low level to deny the existence of the write signal when the write signal is low at the time the strobe goes high.

33. The device of claim 32, wherein the latch includes a S input, a R input, a Q output, and a Q' output, wherein the S input receives the enabling signal and the R input receives the disabling signal, wherein the Q output produces the disabling signal and the Q' output reproduces at least one of the enabling signal and the disabling signal, wherein the Q output produces the disabling signal at a high logic level and the Q' output reproduces the enabling signal when the S input receives the enabling signal at a low logic level, and wherein the Q' output produces the disabling signal at a high logic level when the R input receives the disabling signal at a low logic level.

34. The device of claim 33, wherein the disabling circuit receives the disabling signal from the Q output of the latch and the strobe, wherein the disabling circuit passes the disabling signal to the R input of the latch when the disabling signal is low, the strobe goes high, and the write signal is low.

35. The device of claim 34, wherein the inverting circuit couples to the Q' output of the latch and presents at least one of an enabling signal, which is low to enable the recognition, and a disabling signal, which is high to disable the recognition.

36. A synchronous DRAM, comprising:
a bank that defines a portion of a memory array;
at least one data input buffer that produces one bit of data; and
a device that executes at least one of two acts, wherein the two acts include enabling and disabling the at least one data input buffer, wherein the act of enabling enables the at least one data input buffer to recognize a first rising edge of a strobe before a write signal is confirmed so as to validate the data within a desired duration.

37. The synchronous DRAM of claim 36, wherein the at least one data input buffer includes a latch that latches data to be written to the bank when the data input buffer is enabled.

38. The synchronous DRAM of claim 37, further comprising at least one data multiplexer couples to the latch so as to support a desired memory configuration.

39. The synchronous DRAM of claim 38, further comprising at least one write-driver circuit couples to the at least one data multiplexer so as to write the one bit of data to a desired memory location in the bank.

40. The synchronous DRAM of claim 36, wherein the device is receptive to a collection of signals, wherein the collection of signals includes a row-address strobe, a column-address strobe, a chip-select signal, and a write-enable signal, wherein the device enables the at least one data input buffer when every signal of the collection of signals is high without waiting to confirm that the write signal exists.

* * * * *